(12) United States Patent
Ikemoto

(10) Patent No.: US 11,239,813 B2
(45) Date of Patent: Feb. 1, 2022

(54) RESONANT CIRCUIT ELEMENT AND CIRCUIT MODULE

(71) Applicant: Murata Manufacturing Co., Ltd., Kyoto-fu (JP)

(72) Inventor: Kiyomi Ikemoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 149 days.

(21) Appl. No.: 16/572,269

(22) Filed: Sep. 16, 2019

(65) Prior Publication Data

US 2020/0014361 A1 Jan. 9, 2020

Related U.S. Application Data

(63) Continuation of application No. PCT/JP2018/008765, filed on Mar. 7, 2018.

(30) Foreign Application Priority Data

May 8, 2017 (JP) .............................. JP2017-092221

(51) Int. Cl.
*H03H 7/01* (2006.01)
*H01F 17/00* (2006.01)
(Continued)

(52) U.S. Cl.
CPC ....... *H03H 7/0115* (2013.01); *H01F 17/0006* (2013.01); *H01F 27/40* (2013.01); *H01G 4/40* (2013.01); *H03H 1/00* (2013.01); *H05K 1/0231* (2013.01); *H05K 1/0233* (2013.01); H01F 2017/006 (2013.01); H01F 2017/0073 (2013.01); H01F 2017/0093 (2013.01);
(Continued)

(58) Field of Classification Search
CPC ...... H01P 3/08; H01P 7/08; H03H 2001/0085
USPC .......................................................... 333/175
See application file for complete search history.

(56) References Cited

U.S. PATENT DOCUMENTS

| 2012/0200167 | A1 | 8/2012 | Orihara et al. |
| 2014/0369081 | A1* | 12/2014 | Maniktala ........... H02M 3/3376 363/21.02 |
| 2018/0130596 | A1 | 5/2018 | Yamaguchi |

FOREIGN PATENT DOCUMENTS

| JP | S58-053807 A | 3/1983 |
| JP | S58137206 A | 8/1983 |

(Continued)

OTHER PUBLICATIONS

An Office Action; "Notification of Reasons for Refusal," Mailed by the Japanese Patent Office dated Sep. 10, 2019, which corresponds to Japanese Patent Application No. 2019-516904 and is related to U.S. Appl. No. 16/572,269; with English language translation.

(Continued)

*Primary Examiner* — Rakesh B Patel
(74) *Attorney, Agent, or Firm* — Studebaker & Brackett PC

(57) ABSTRACT

A first conductive pattern made from a conductive material is formed on a first surface that is one surface of a flexible film made from a dielectric material. An adhesive layer is disposed on a second surface opposite to the first surface of the flexible film. A pair of first outer electrodes generates an electric field in an in-plane direction of a composite member composed of the flexible film and the adhesive layer, and causes an electric current to flow through the first conductive pattern.

10 Claims, 4 Drawing Sheets

(51) Int. Cl.
*H01F 27/40* (2006.01)
*H01G 4/40* (2006.01)
*H03H 1/00* (2006.01)
*H05K 1/02* (2006.01)

(52) U.S. Cl.
CPC ............. *H05K 2201/1003* (2013.01); *H05K 2201/10015* (2013.01)

(56) References Cited

FOREIGN PATENT DOCUMENTS

| | | |
|---|---|---|
| JP | 2003-249832 A | 9/2003 |
| JP | 2008135430 A | 6/2008 |
| WO | 2011013662 A1 | 2/2011 |
| WO | 2017018109 A1 | 2/2017 |

OTHER PUBLICATIONS

International Search Report issued in PCT/JP2018/008765; dated May 29, 2018.
Written Opinion issued in PCT/JP2018/008765; dated May 29, 2018.

* cited by examiner

RESONANT CIRCUIT ELEMENT AND CIRCUIT MODULE

This application claims benefit of priority to International Patent Application No. PCT/JP2018/008765, filed Mar. 7, 2018, and to Japanese Patent Application No. 2017-092221, filed May 8, 2017, the entire contents of each are incorporated herein by reference.

BACKGROUND

Technical Field

The present disclosure relates to a resonant circuit element and a circuit module.

Background Art

Electromagnetic interference (EMI) stop filters have been used as a countermeasure for noise particularly noise at high frequencies in electronic devices. Japanese Unexamined Patent Application Publication No. 2003-249832 discloses an EMI filter including an inductor and a capacitor arranged in parallel. The capacitor of the EMI filter has a multilayer structure in which each of a plurality of grounded conductor layers and each of another plurality of conductor layers are alternately layered, with individual ceramic layers interposed between the individual layers. The inductor is constructed of conductor patterns, with each conductor pattern and each of the plurality of non-grounded conductor layers of the capacitor being arranged in the same layer.

SUMMARY

The EMI filter disclosed in Japanese Unexamined Patent Application Publication No. 2003-249832 has a multilayer structure including ceramic layers and thus lacks mechanical flexibility. Thus, allowable geometric shapes of the intended mounting location are limited.

Accordingly, the present disclosure provides a resonant circuit element mountable in locations of varying shapes. The present disclosure also provides a circuit module including the resonant circuit element on board.

A resonant circuit element according to a first aspect of the present disclosure includes a flexible film made from a dielectric material; a first conductive pattern made from a conductive material and formed on a first surface that is one surface of the flexible film; an adhesive layer disposed on a second surface opposite to the first surface of the flexible film; and a pair of first outer electrodes configured to generate an electric field in an in-plane direction of a composite member composed of the flexible film and the adhesive layer and to cause an electric current to flow through the first conductive pattern.

The first conductive pattern functions as an inductor, and the pair of outer electrodes and the composite member function as a capacitor. The inductor and the capacitor constitute an LC resonant circuit. Altering the shape of the flexible film enables the resonant circuit element to be mountable in mounting locations of varying geometric shapes. The adhesive layer enables the resonant circuit element to be bonded to the mounting location.

In addition to having the configuration of the resonant circuit element according to the first aspect, a resonant circuit element according to a second aspect of the present disclosure is characterized in that each of the first outer electrodes constituting the pair includes a portion formed on a corresponding end face of the composite member.

Forming the pair of outer electrodes on corresponding end faces of the composite member enables efficient generation of an electric field in an in-plane direction of the composite member.

In addition to having the configuration of the resonant circuit element according to the first or second aspect, a resonant circuit element according to a third aspect of the present disclosure includes a second conductive pattern made from a conductive material and formed on the first surface; and a pair of second outer electrodes configured to cause an electric current to flow through the second conductive pattern and to generate an electric field in an in-plane direction of the composite member, in which the first conductive pattern and the second conductive pattern constitute a choke coil.

A choke coil, the shape of which may be flexibly altered in accordance with the geometric shape of the mounting location, may be realized accordingly. The LC resonant circuit connecting the first outer electrodes constituting the pair to each other functions as a band-stop filter. Similarly, an LC resonant circuit connecting the second outer electrodes constituting the pair to each other functions as a band-stop filter.

In addition to having the configuration of the resonant circuit element according to any one of the first, second, and third aspects, a resonant circuit element according to a fourth aspect of the present disclosure is characterized in that the adhesive layer is formed from a thermosetting or photo-curable adhesive.

The adhesive layer of the resonant circuit element may be easily cured by application of heat or irradiation with light after being bonded to the mounting location.

A circuit module according to a fifth aspect of the present disclosure includes a printed circuit board provided with a plurality of conductive portions; and a resonant circuit element mounted on the printed circuit board and connecting two conductive portions of the plurality of conductive portions to each other. The resonant circuit element includes a flexible film made from a dielectric material, a first conductive pattern made from a conductive material and formed on a first surface that is one surface of the flexible film, an adhesive layer disposed on a second surface opposite to the first surface of the flexible film, and a pair of outer electrodes configured to generate an electric field in an in-plane direction of a composite member composed of the flexible film and the adhesive layer and to cause an electric current to flow through the first conductive pattern. Also, each of the outer electrodes constituting the pair is electrically connected to a corresponding one of the two conductive portions and the resonant circuit element is bonded to the printed circuit board via the adhesive layer.

Bonding the resonant circuit element to the printed circuit board enables easy fixation to the printed circuit board.

In addition to having the configuration of the circuit module according to the fifth aspect, a circuit module according to a sixth aspect of the present disclosure is characterized in that the printed circuit board has a step at a location where the resonant circuit element is mounted and that the resonant circuit element has a shape altered to reflect the step on the printed circuit board.

Altering the shape of the resonant circuit element enables the resonant circuit element to be easily mountable on printed circuit boards provided with various steps.

The first conductive pattern functions as an inductor, and the pair of outer electrodes and the composite member function as a capacitor. The inductor and the capacitor constitute an LC resonant circuit. Altering the shape of the flexible film enables mounting in mounting locations of varying geometric shapes. The adhesive layer enables the resonant circuit element to be bonded to the mounting location.

DETAILED DESCRIPTION

With reference to FIGS. 1A to 2C, the following describes a resonant circuit element according to a first exemplary embodiment.

Figure 1A:
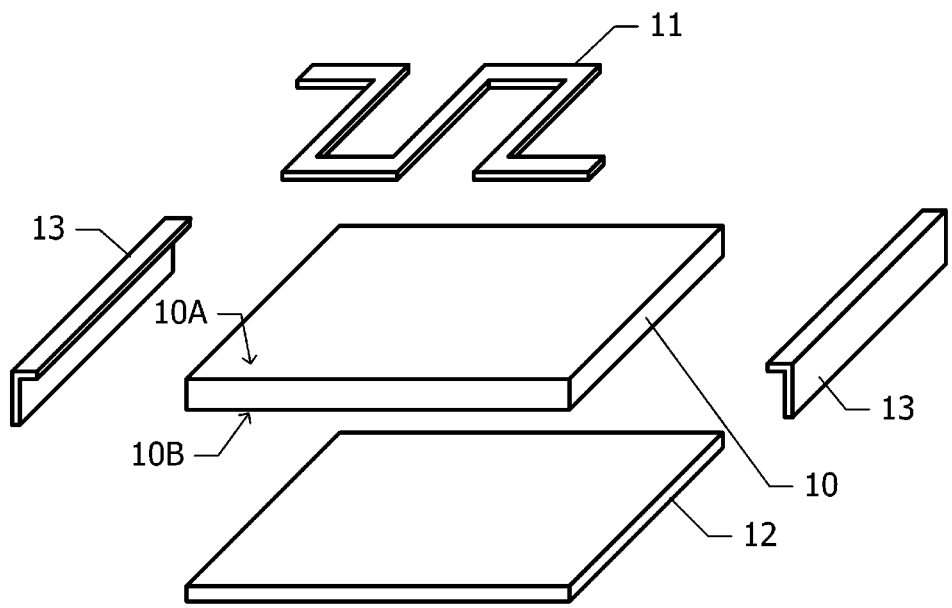
FIGS. 1A, 1B, and 1C are an exploded perspective view, a perspective view, and a sectional view, respectively, of a resonant circuit element according to a first exemplary embodiment.
Figure 1B:
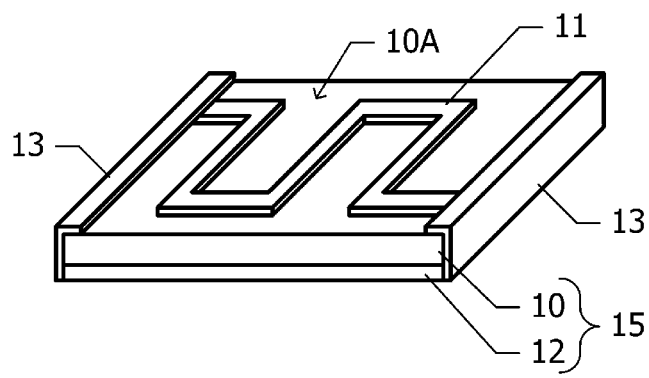
Figure 1C:
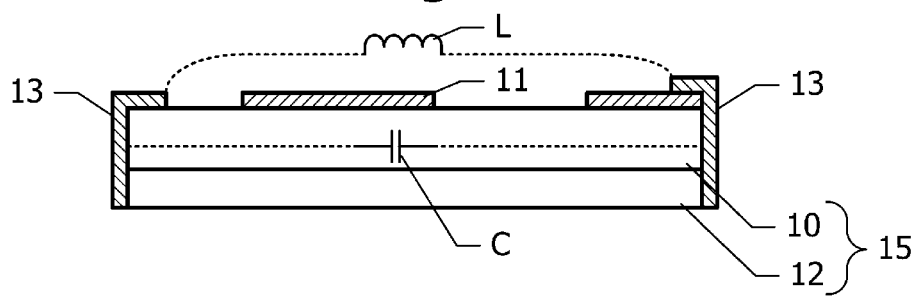

FIGS. 1A, 1B, and 1C are an exploded perspective view, a perspective view, and a sectional view, respectively, of the resonant circuit element according to the first exemplary embodiment. The resonant circuit element according to the first exemplary embodiment includes a flexible film 10, a first conductive pattern 11, an adhesive layer 12, and a pair of first outer electrodes 13.

Dielectric materials such as polyimides and other resins may be used as the flexible film 10. The first conductive pattern 11 is disposed on one surface (hereinafter referred to as a first surface 10A) of the flexible film 10. Conductive materials such as copper (Cu) may be used as the first conductive pattern 11. The first conductive pattern 11 has a meander shape in plan view. A piece of copper foil formed into a desired shape may be bonded to the flexible film 10 via an adhesive to form the first conductive pattern 11.

The adhesive layer 12 is disposed on a second surface 10B opposite to the first surface 10A of the flexible film 10. Thermosetting or photo-curable adhesives, for example, may be used as the adhesive layer 12. In the case where such a photo-curable adhesive is to be used as the adhesive layer 12, the flexible film 10 is formed from a material that transmits light of a certain wavelength range for curing. The adhesive layer 12 retains its tackiness while the resonant circuit element remains to be mounted. A multilayer body composed of the flexible film 10 and the adhesive layer 12 is herein referred to as a composite member 15. The composite member 15 has a dielectric constant lower than the dielectric constants of commonly used ceramics.

Each of the first outer electrodes 13 constituting the pair is formed on a corresponding end face of the composite member 15. For example, the composite member 15 has a rectangular shape in plan view, and the pair of first outer electrodes 13 includes portions formed on the corresponding end faces of the composite member 15 that are oppositely oriented. A portion of each of the first outer electrodes 13 covers a region in the vicinity of an edge of the first surface 10A. Alternatively, each of the first outer electrodes 13 may cover the vicinity of an edge of the second surface 10B. The first outer electrodes 13 may be formed, for example, by using printing techniques. Each of the first outer electrodes 13 constituting the pair is electrically connected to a corresponding end of the first conductive pattern 11. Generating a potential difference between the first outer electrodes 13 constituting the pair causes an electric field to be generated mainly in an in-plane direction of the composite member 15 and causes an electric current to flow through the first conductive pattern 11. The first conductive pattern 11 functions as an inductor L (FIG. 1C) connected between the first outer electrodes 13 constituting the pair. The shape of the first conductive pattern 11 in plan view is not necessarily a meander-like shape and may be another shape depending on the desired inductance. The composite member 15 and the pair of first outer electrodes 13 function as a capacitor C (FIG. 1C).

A resonant circuit element according to the first exemplary embodiment was actually produced to conduct measurements of electrical characteristics, and the following describes results of the measurements.

Figure 2A:
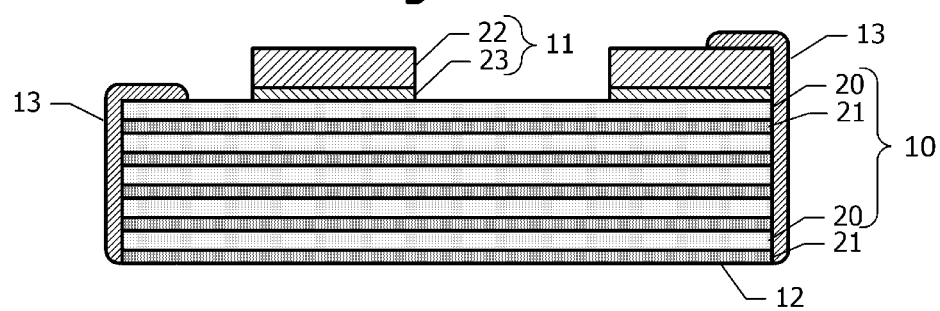
FIG. 2A is a schematic sectional view of an actually produced resonant circuit element.

FIG. 2A is a schematic sectional view of the actually produced resonant circuit element. Polyimide tapes each being a polyimide film 20 having one surface coated with a heat-resistant silicone adhesive 21 were layered in five layers to constitute the flexible film 10. The shape of the flexible film 10 in plan view is a rectangle with a long side of about 2 cm and a short side of about 1 cm. The adhesive 21 of the polyimide tape as the lowermost layer corresponds to the adhesive layer 12 (FIGS. 1B and 1C). The polyimide film 20 has a thickness of 0.05 mm and has a relative dielectric constant of 3.3 at 1 MHz. The heat-resistant silicone adhesive 21 has a thickness of 0.02 mm and has a relative dielectric constant of 3.3 at 1 MHz.

A piece of copper foil 22 having one surface coated with a conductive adhesive 23 was bonded to the flexible film 10 to form the first conductive pattern 11. The piece of copper foil 22 has a thickness of 0.07 mm and the conductive adhesive 23 has a thickness of 0.02 mm. The conductive adhesive 23 has a relative dielectric constant of 3.0 at 1 MHz. The first outer electrodes 13 were formed by using printing techniques.

Figure 2B:
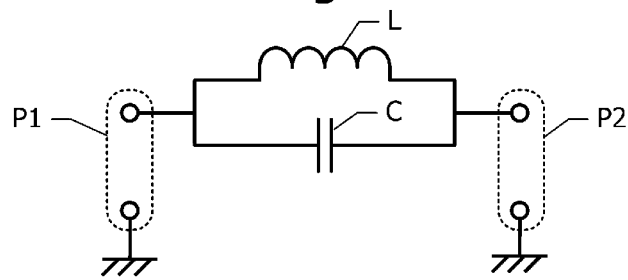
FIG. 2B is an equivalent circuit diagram of a filter including the resonant circuit element illustrated in FIG. 2A.

FIG. 2B is an equivalent circuit diagram of a filter including a resonant circuit element. One terminal of a first port P1 and one terminal of a second port P2 are grounded, and the resonant circuit element illustrated in FIG. 2A, or equivalently, a parallel resonant circuit including the inductor L and the capacitor C is connected between the other end of the first port P1 and the other end of the second port P2.

Figure 2C:
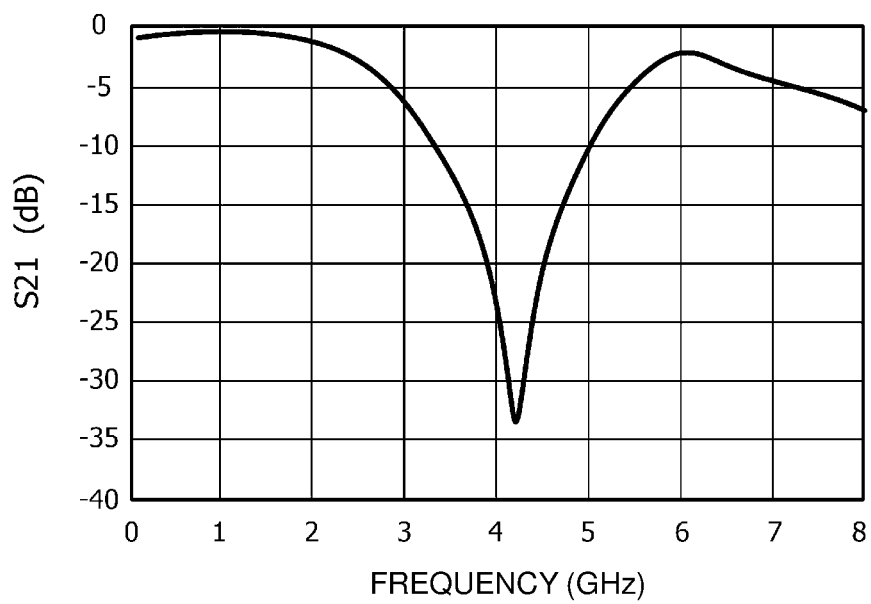
FIG. 2C is a graph showing results of measurements of the S (Scattering) parameter S21 of the filter illustrated in FIG. 2B.

FIG. 2C is a graph showing results of measurements of the S (Scattering) parameter S21 of the filter illustrated in FIG. 2B. The horizontal axis represents the frequency in units of GHz and the vertical axis represents S21 in units of dB. Resonance occurred at about 4.2 GHz, as illustrated by S21 indicating the minimum value. It was accordingly confirmed that the resonant circuit element illustrated in FIG. 2A operates as an LC resonant circuit.

The following describes advantages of the resonant circuit element according to the first exemplary embodiment.

The shape of the resonant circuit element according to the first exemplary embodiment may be easily altered owing to the flexible film 10 included therein. Thus, even if the intended mounting location is not flat, the shape of the resonant circuit element may be altered in accordance with the shape of the intended mounting location so that the resonant circuit element becomes mountable. The resonant circuit element may be bonded to the mounting substrate such that the surface at which the adhesive layer 12 (FIG. 1B) is exposed faces the mounting substrate. Subsequent to the bonding procedure, the adhesive layer 12 may be cured by, for example, application of heat or irradiation with light so that the resonant circuit element may be easily fixed to the mounting substrate. The first outer electrodes 13 (FIG. 1B) may, for example, be soldered to be electrically connected to conductor portions intended.

Since the first conductive pattern 11 (FIG. 1B) that operates as an inductor has a single-layer configuration instead of being layered, the first conductive pattern 11 may have a greater thickness. Increasing the thickness of the first conductive pattern 11 may reduce the electrical resistance of the first conductive pattern 11. Thus, a high current may be handled. Furthermore, the configuration in which the first conductive pattern 11 is not layered enables the thickness of the first conductive pattern 11 to be adjusted as desired, with the other structures left unaffected. Adjusting the thickness of the first conductive pattern 11 enables adjustment of the inductance.

Figure 3A:
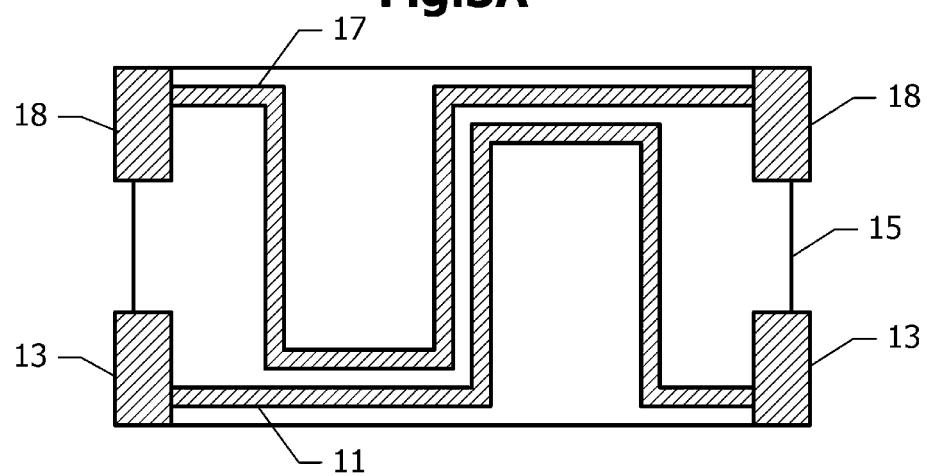
FIG. 3A is a plan view of a resonant circuit element according to a second exemplary embodiment.
Figure 3B:
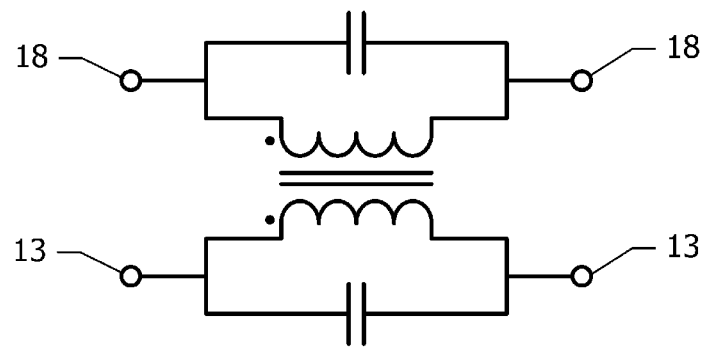
FIG. 3B is an equivalent circuit diagram of the resonant circuit element according to the second exemplary embodiment.

With reference to FIGS. 3A and 3B, the following describes a resonant circuit element according to a second exemplary embodiment. Description of configurations identical to those of the resonant circuit element according to the first exemplary embodiment is omitted here.

FIG. 3A is a plan view of the resonant circuit element according to the second exemplary embodiment. In FIG. 3A, the conductor portions are hatched. In addition to the first conductive pattern 11, a second conductive pattern 17 is disposed on the upper surface of the composite member 15. The first conductive pattern 11 and the second conductive pattern 17 lie side by side in part and are electromagnetically coupled to each other.

In addition to the pair of first outer electrodes 13, a pair of second outer electrodes 18 is formed on the end faces of the composite member 15. The second outer electrodes 18 constituting the pair are connected to corresponding ends of the second conductive pattern 17.

FIG. 3B is an equivalent circuit diagram of the resonant circuit element according to the second exemplary embodiment. A parallel resonant circuit including an inductor and a capacitor is connected between the first outer electrodes 13 constituting the pair as in the first exemplary embodiment, and another parallel resonant circuit including an inductor and a capacitor is connected between the second outer electrodes 18 constituting the pair. The two inductors are coupled to each other to operate as a common mode choke coil.

Inserting the resonant circuit element according to the second exemplary embodiment into a differential transmission line may minimize leakage of common mode noise. Furthermore, as illustrated in FIG. 2B, the LC parallel resonant circuit functions as a band-stop filter for differential mode signals.

Figure 4:
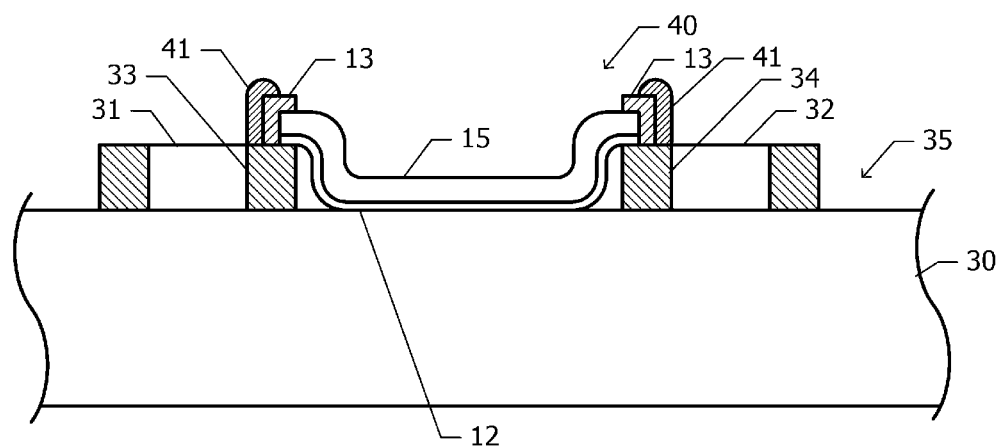
FIG. 4 is a sectional view of a circuit module according to a third exemplary embodiment.

With reference to FIG. 4, the following describes a circuit module according to a third exemplary embodiment.

FIG. 4 is a sectional view of the circuit module according to the third exemplary embodiment. A printed circuit board 35 includes a printed wiring board 30 and circuit elements 31 and 32 mounted therein or thereon. The printed circuit board 35 is provided with a plurality of lands for mounting the circuit elements and a plurality of conductive portions such as terminals 33 and 34 of the respective mounted circuit elements 31 and 32. The upper surfaces of the circuit elements 31 and 32 are each located at a level higher than the position of the upper surface of the printed wiring board 30, thus providing steps on the upper surface of the printed circuit board 35.

A resonant circuit element 40 is mounted on the printed circuit board 35. The resonant circuit element according to the first exemplary embodiment (FIG. 1B) is used as the resonant circuit element 40. One of the first outer electrodes 13 of the resonant circuit element 40 is placed on the terminal 33 of the circuit element 31 and is electrically connected thereto via solder 41. The other of the first outer electrodes 13 of the resonant circuit element 40 is placed on the terminal 34 of the circuit element 32 and is electrically connected thereto via the solder 41. The resonant circuit element 40 is connected between the terminal 33 of the circuit element 31 and the terminal 34 of the circuit element 32.

The location in which the resonant circuit element 40 is mounted has steps formed due to the heights of the circuit elements 31 and 32. The composite member 15 of the resonant circuit element 40 has a shape altered to reflect the steps on the upper surface of the printed circuit board 35. The adhesive layer 12 of the resonant circuit element 40 is bonded to the upper surface of the printed circuit board 35 and cured thereon. Curing the adhesive layer 12 enables the resonant circuit element 40 to be fixed to the printed circuit board 35.

The following describes advantages of the resonant circuit element 40 according to the third exemplary embodiment. Use of a hard material such as a ceramic in a resonant circuit element makes it difficult to alter the shape of the resonant circuit element in accordance with the steps on the upper surface of the printed circuit board 35. When being applied to the exemplary embodiment illustrated in FIG. 4, such a hard resonant circuit element extends between the circuit element 31 and the circuit element 32 and is suspended in midair accordingly.

In the third exemplary embodiment, the resonant circuit element 40 has a shape altered in accordance with the steps on the upper surface of the printed circuit board 35 and is bonded and fixed to the upper surface of the printed circuit board 35 between the circuit element 31 and the circuit element 32. This enables the resonant circuit element 40 to be securely fixed with increased durability.

For example, after the completion of circuit module designing, the resonant circuit element 40 may be mounted to counter noise. The resonant circuit element 40 may be mounted so as to be superposed on the circuit elements mounted in or on the printed wiring board 30.

The exemplary embodiments described above are merely examples. Needless to say, partial replacements or combinations of configurations illustrated according to different exemplary embodiments are possible. Similar actions and effects caused by similar configurations according to multiple exemplary embodiments are not described for each exemplary embodiment. Furthermore, the present disclosure is not intended to be limited to the above-described exemplary embodiments. For example, it will be obvious to those skilled in the art that various changes, improvements, combinations, and the like may be made.

What is claimed is:
1. A resonant circuit element comprising:
a flexible film made from a dielectric material;
a first conductive pattern made from a conductive material and formed on a first surface that is one surface of the flexible film;

an adhesive layer disposed on a second surface opposite to the first surface of the flexible film; and a pair of first outer electrodes configured to generate an electric field in an in-plane direction of a composite member composed of the flexible film and the adhesive layer, and to cause an electric current to flow through the first conductive pattern, wherein the adhesive layer adheres the resonant circuit element to a mounting substrate on which the resonant circuit element is mounted, and the adhesive layer is formed on an outermost layer of the resonant circuit element.

2. The resonant circuit element according to claim 1, wherein each of the first outer electrodes of the pair includes a portion formed on a corresponding end face of the composite member.

3. The resonant circuit element according to claim 1, further comprising:

a second conductive pattern made from a conductive material and formed on the first surface; and a pair of second outer electrodes configured to cause an electric current to flow through the second conductive pattern and to generate an electric field in an in-plane direction of the composite member, wherein the first conductive pattern and the second conductive pattern constitute a choke coil.

4. The resonant circuit element according to claim 1, wherein the adhesive layer is formed from a thermosetting or photo-curable adhesive.

5. The resonant circuit element according to claim 2, further comprising:

a second conductive pattern made from a conductive material and formed on the first surface; and a pair of second outer electrodes configured to cause an electric current to flow through the second conductive pattern and to generate an electric field in an in-plane direction of the composite member, wherein the first conductive pattern and the second conductive pattern constitute a choke coil.

6. The resonant circuit element according to claim 2, wherein the adhesive layer is formed from a thermosetting or photo-curable adhesive.

7. The resonant circuit element according to claim 3, wherein the adhesive layer is formed from a thermosetting or photo-curable adhesive.

8. The resonant circuit element according to claim 5, wherein the adhesive layer is formed from a thermosetting or photo-curable adhesive.

9. A circuit module comprising:

a printed circuit board provided with a plurality of conductive portions; and a resonant circuit element mounted on the printed circuit board and connecting two conductive portions of the plurality of conductive portions to each other, wherein the resonant circuit element includes a flexible film made from a dielectric material, a first conductive pattern made from a conductive material and formed on a first surface that is one surface of the flexible film, an adhesive layer disposed on a second surface opposite to the first surface of the flexible film, and a pair of outer electrodes configured to generate an electric field in an in-plane direction of a composite member composed of the flexible film and the adhesive layer, and to cause an electric current to flow through the first conductive pattern, each of the outer electrodes of the pair is electrically connected to a corresponding one of the two conductive portions, and the resonant circuit element is bonded to the printed circuit board via the adhesive layer, the adhesive layer adheres the resonant circuit element to the printed circuit board on which the resonant circuit element is mounted, and the adhesive layer is formed on an outermost layer of the resonant circuit element.

10. A circuit module according to claim 9, wherein the printed circuit board has a step at a location where the resonant circuit element is mounted, and the resonant circuit element has a shape altered to reflect the step on the printed circuit board.

* * * * *